United States Patent [19]

Kagawa et al.

[11] Patent Number: 4,931,797

[45] Date of Patent: Jun. 5, 1990

[54] FOLDING CIRCUIT AND SERIAL-TYPE A/D CONVERTER

[75] Inventors: Minoru Kagawa, Osaka; Akira Matsuzawa, Neyagawa, both of Japan

[73] Assignee: Matsushita Electric Industrial Co., Ltd., Osaka, Japan

[21] Appl. No.: 272,056

[22] Filed: Nov. 14, 1988

[30] Foreign Application Priority Data

Nov. 11, 1987 [JP] Japan .................. 62-284505
Jun. 7, 1988 [JP] Japan .................. 63-139984

[51] Int. Cl.⁵ .......................................... H03M 1/44
[52] U.S. Cl. ....................... 341/162; 341/159; 341/169; 330/84; 330/260; 307/362
[58] Field of Search ............... 341/118, 120, 133, 138, 341/140, 155, 159, 162, 169, 170; 330/84, 69, 260, 124 R; 307/350, 360, 362

[56] References Cited

U.S. PATENT DOCUMENTS

| | | | |
|---|---|---|---|
| 4,093,876 | 6/1978 | Henein et al. | 307/362 |
| 4,143,363 | 3/1979 | Potter, Jr. | 341/138 |
| 4,353,059 | 10/1982 | Vaitkus | 341/156 |
| 4,390,864 | 6/1983 | Ormond | 341/169 |
| 4,393,368 | 7/1983 | Rasmussen | 341/156 |
| 4,517,523 | 5/1985 | Miles | 330/84 |
| 4,549,165 | 10/1985 | Brian | 341/118 |
| 4,563,596 | 1/1986 | Gosselin et al. | 307/360 |
| 4,599,602 | 7/1986 | Matzuzawa et al. | |
| 4,647,905 | 3/1987 | Hantke et al. | 341/118 |
| 4,667,180 | 5/1987 | Robinson | 341/135 |
| 4,691,190 | 9/1987 | Robinson | 341/122 |
| 4,806,797 | 2/1989 | Yamazaki | 307/362 |
| 4,859,873 | 8/1989 | O'Shaughnessy et al. | 307/360 |

Primary Examiner—William M. Shoop, Jr.
Assistant Examiner—Gary J. Romano
Attorney, Agent, or Firm—Wenderoth, Lind & Ponack

[57] ABSTRACT

A serial-type analog-to-digital converter includes a plurality of serially connected folding circuits. Each folding circuit includes a first operational amplifier having an inverting input connected to an input terminal, and a second operational amplifier having a noninverting input connected to the input terminal. The bases of first and second transistors are respectively connected to the outputs of the first and second operational amplifiers. The emitters of the transistors are commonly connected to an output terminal. Feedback connections are provided for coupling the output terminal to the inverting input of each operational amplifier. Furthermore, circuitry is provided for calculating an estimated offset error based on maximum values of a folded analog signal provided at an output terminal of one of the folding circuits.

4 Claims, 11 Drawing Sheets

FOLDING CIRCUIT AND SERIAL-TYPE A/D CONVERTER

BACKGROUND OF THE INVENTION

This invention relates to a serial-type analog-to-digital converter (A/D converter) composed by serially connecting a folding circuit.

A conventional folding circuit diagram is shown in FIG. 6, in which $B_{01}$ denotes a noninverting amplifier circuit having an output connected to the base of a transistor $Q_{01}$. Reference number $B_{02}$ denotes an inverting amplifier circuit having an output connected to the base of a transistor $Q_{02}$. The emitters of the transistors $Q_{01}$, $Q_{02}$ are commonly connected to a current source $IE_1$, and are wired to an output terminal $P_4$.

The operation of the thus composed conventional folding circuit is explained by referring to the diagram of FIG. 7. The output voltage of the noninverting amplifier circuit $B_{01}$ is indicated by the broken line, and the output voltage of the inverting amplifier circuit $B_{02}$ is represented by the single-dot chain line. These voltages respectively enter into the bases of the transistors $Q_{01}$, $Q_{02}$, but since the emitters are commonly connected, the voltage of the output is determined according to the higher one of the potentials applied to the bases of the transistors $Q_{01}$, $Q_{02}$, and a folding characteristic as indicated by the solid line in FIG. 7 is obtained.

In the emitter-coupled output circuit having the above-described constitution, however, the current is divided into two transistors near the folding point, and the current flowing in one transistor is reduced by one half. Accordingly, the potential difference between the base and emitter becomes small, and nonlinearity results. Furthermore, the output voltage fluctuates depending on the temperature.

On the other hand, the structure of a conventional serial-type A/D converter is shown in FIG. 12, in which the analog output of the folding circuit 1-1 is connected to the analog input of a folding circuit 1-2, and the analog output of this folding circuit 1-2 is connected to the analog input of a folding circuit 1-3. Thereafter, the folding circuits 1-3 to 1-5 are similarly connected in a serial manner.

In the thus composed conventional serial-type A/D converter, an analog input signal is applied to the analog input terminal of the folding circuit 1-1, and with respect to this input voltage, the analog output voltage and digital output are determined as shown in FIG. 9. This digital output corresponds to the highest bit of the gray code. The second folding circuit 1-2 and the subsequent ones operate similarly, and their digital outputs continue sequentially to the second bit, third bit and so forth from the highest position of the gray code.

In such a structure, however, the precision of the folding circuit is determined by the precision of the entire A/D converter, and it was difficult to fabricate a high-precision serial-type A/D converter monolithically.

When the analog input voltage of the conventional serial-type A/D converter shown in FIG. 12 is scanned by a ramp voltage, the analog output of the folding circuit 1-5 is folded 31 times as shown in FIG. 13. Since each one of the folding circuits 1-1 to 1-5 contains a gain error and an offset error, the maximal value and minimal value of the folding output are deviated from the standard values. The minimal value has a very small error because it is due to only the folding circuit 1-5 in the final stage, but the error of the maximal value is doubled in deviation as passing every stage of the folding circuit, the error attributable to the earlier folding circuit is greater.

The maximum output voltage is expanded in the error, while the minimum output voltage contains an error only due to the final stage. In the folding circuit, it is when the input voltage is near the middle of the input voltage range that the output voltage becomes the minimum. By contrast, it is when the input voltage is at the end point of the input voltage range that the output voltage reaches the maximum. If this end point voltage is deviated from the specified voltage (input voltage range), its deviation is doubled to become the end point deviation of the output voltage.

In the folding circuit shown in FIG. 1, noninverting amplification is carried out around the operational amplifier $A_{01}$, and inverting amplification is conducted around the operational amplifier $A_{02}$, and the greater system of these two output voltages becomes predominant. FIG. 10 shows input, output characteristics when there is an offset error Vf in the inverting amplification system. If there is an offset, the deviation of the analog output voltage range has the greatest effect on the entire system. This deviation of the output voltage range is sequentially doubled in the subsequent folding circuits, and the maximal value of the analog output voltage in the final stage is largely deviated. FIG. 11 shows a relation between an analog signal input and an analog output of a certain stage, in which the vicinity of the maximal value is magnified. The line expressing the track with circles denote to the input, output characteristic curve without deviation, and the triangle and square marks denote the input, output characteristics of which maximal values are deviated to the positive side and negative side, respectively. Deviation of the maximal value to the positive side results in a widening of the input voltage range corresponding to the digital output at the folding point. To the contrary, when the maximal value is deviated to the negative side, the input voltage range corresponding to the digital output at the folding point is narrowed, and when the deviation is particularly large, a defect is formed in the digital output. In the example shown in FIG. 11, digital values "32, 33" are not delivered. These deviations of maximal value mean differential nonlinearity errors of the A/D converter. When fabricating a serial-type A/D converter monolithically, it has been difficult to obtain a high accuracy because of the error in the folding circuits.

SUMMARY OF THE INVENTION

It is hence a primary object of this invention to present a folding circuit capable of controlling the degree of amplification at a high accuracy and with excellent in linearity, and more particularly to a serial-type A/D converter connecting such circuits serially having an especially small differential nonlinearity error.

To achieve the above object, the folding circuit of this invention comprises two operational amplifiers, having the base of a transistor connected to each output, in which a negative feedback is applied from the emitter of the transistor to the inverting input of the operational amplifiers through a resistance, and input terminals are connected so that one amplifying system may be inverting amplification while the other amplifying system may be noninverting amplification, and the emitter of the output transistor is commonly connected.

In this constitution, when the degree of amplification of the operational amplifier is sufficiently large, the degree of amplification of the entire circuit may be determined by the ratio of the resistance of feedback circuit, and the voltage between the base and emitter is contained in the negative feedback circuit, so that the nonlinearity near the folding point is improved.

Furthermore, in order to achieve the above object, this invention presents a serial-type analog-to-digital converter comprising a folding circuit having an offset adjusting function (bias terminal), an analog signal maximal value detecting part, an operational part for obtaining a correction offset amount from the maximal value of the folding output, a correction offset memory for storing the correction offset amount, and a ramp voltage generator for scanning the voltage of the analog input terminal.

In this structure, the ramp voltage generator is operated when calibrating to obtain an analog input signal of the serial-type A/D converter, and the deviation of the maximal value is obtained in the analog signal maximal value detecting part from the analog folding output at this time, and the offset amount of each stage to minimize the deviation of the maximal value is determined in the correction offset operational part, and this offset value is stored in the correction offset memory, from which an offset of each stage is given.

When the maximal value of the output voltage of a certain stage becomes low, generally the width of the input voltage corresponding to the digital output containing the maximal value is narrowed in width. This is the differential nonlinearity error. Therefore, by detecting the deviation of the maximal value and reducing this deviation, the differential nonlinearity is decreased.

As the means for controlling the output voltage at the maximal value, it is an easy method to shift the offset of the operational amplification system used in the folding circuit. For example, in FIG. 1, the voltage of the bias terminals P2, P3 should be deviated. By intentially giving an offset to the folding circuit, it may be possible to adjust the maximal value of the analog folding output. That is, the differential nonlinearity error can be improved.

DETAILED DESCRIPTION OF THE INVENTION

Figure 1:
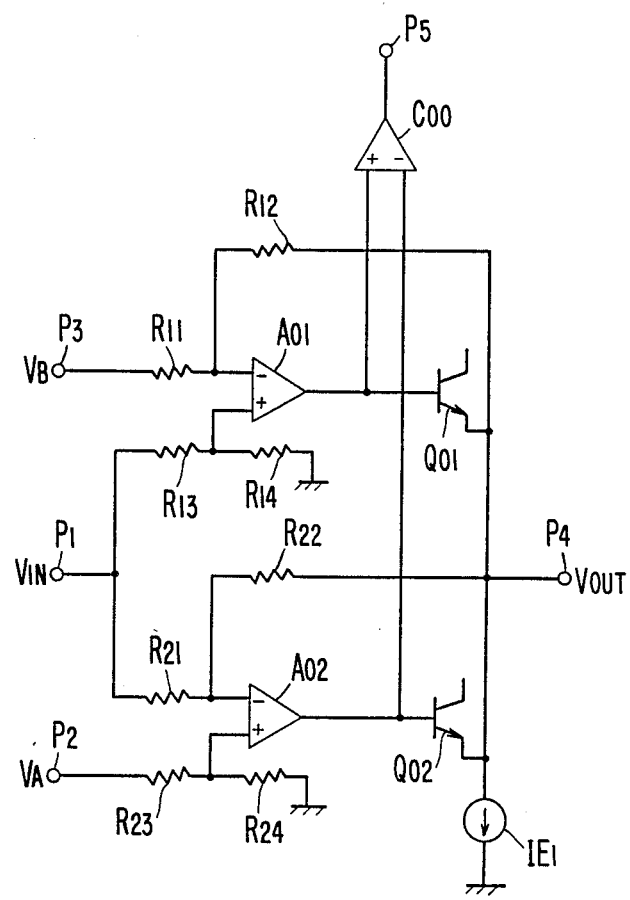
FIG. 1 is a circuit diagram of a folding circuit in a first embodiment of the invention.

Referring now to FIG. 1, which is a circuit diagram of a folding circuit in a first embodiment of the invention, P1 denotes a signal input terminal, P4 denote a signal output terminal, A01, A02 denote operational amplifiers having output connected to the bases of transistors $Q_{01}$, $Q_{02}$, respectively. Reference numbers R11, R12 denote resistances for negative feedback. The voltage of a bias terminal P3 and the emitter of the output transistor $Q_{01}$ are divided, and are applied to the inverting input of the operational amplifier A01. Resistances R13, R14 divide the voltage of the signal input terminal P1, and for application to the noninverting input of the operational amplifier A02. Resistances R21, R22 are for negative feedback, and divide the signal input terminal P1 and emitter voltage of output transistor $Q_{02}$, for application to the noninverting input of the operational amplifier A02. Resistances R23, R24 divide the voltage of the bias terminal P2, and apply to the noninverting input of the operation amplifier A02. A current source IE1 is connected to the emitters of the output transistors $Q_{01}$, $Q_{02}$, and an output terminal P4 is formed.

Furthermore, C00 is a comparator having positive and negative inputs connected to the positive output of amplifier A01 and to the negative output of amplifier A02 respectively, and the comparison result output therefrom is connected to a digital output terminal P5. The comparator C00 and digital output terminal P5 are indispensable for composing a serial-type A/D converter.

The operation of thus composed folding circuit of this embodiment is described below with reference to FIG. 2.

Figure 2:
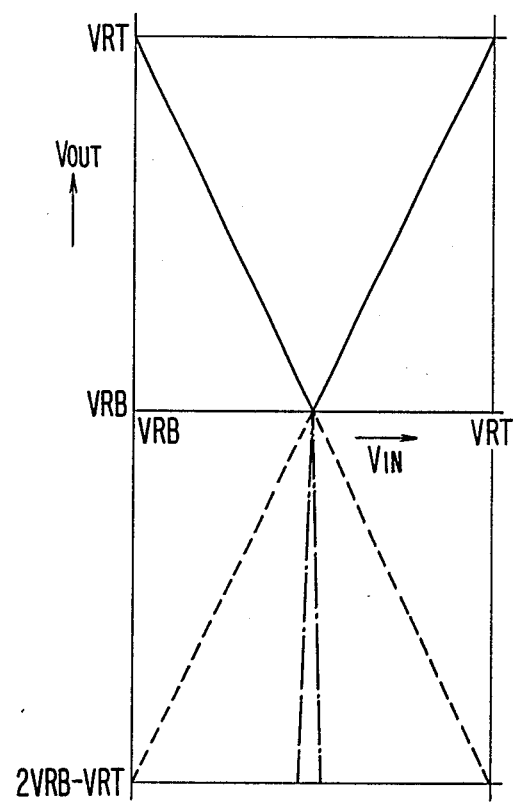
FIG. 2 is an input, output characteristic diagram of the circuit shown in FIG. 1.

A noninverting amplifier circuit is composed of an operational amplifier A01, an output transistor $Q_{01}$, and resistances R11 to R14, and the relation between the input terminal P1 and output terminal P4 is expressed by a solid line and broken line with a positive inclination as shown in FIG. 2. On the other hand, an inverting amplifier circuit is composed of an operational amplifier A02, output an transistor $Q_{02}$, and resistances R21 and R24, and the input, output characteristic is expressed by a solid line and broken line with a negative inclination as shown in FIG. 2.

Here, since the emitters of the output transistors $Q_{01}$, $Q_{02}$ are commonly connected to the output terminal P4, the characteristic becomes as indicated by the solid line in FIG. 2 as being determined by the higher potential of the base potentials. This is because the lower voltage of the output voltages of the operational amplifiers A01, A02 is further lowered in the output potential because the higher output potential of the other amplifier system is negatively fed back, and the base potential of the output transistor is lowered to shut off the current, thereby inhibiting the effect to the output terminal.

Accordingly, the nonlinearity control at the folding part becomes less than the inverse number of the gain of the operational amplifier, and the operation of the amplifier system at the lower output voltage side becomes as indicated by the single-dot chain line in FIG. 2.

Figure 9:
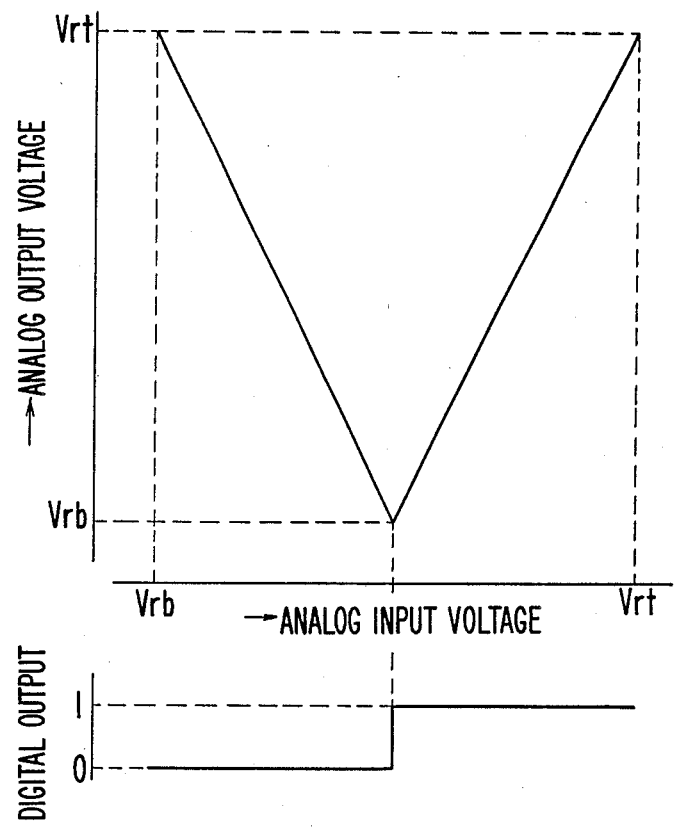
FIG. 9 is an input, output characteristic diagram of an ideal folding circuit.

The comparator C00 compares the outputs of the operational amplifiers A01, A02, but since the lower potential of the outputs of the operational amplifiers A01, A02 is considerably lowered in the potential by the negative feedback as stated above, comparison at high sensitivity is realized. The relation between analog input, output, and digital output of the folding circuit becomes as shown in FIG. 9.

Thus, according to this embodiment, by incorporating the base and emitter of the transistors for composing an emitter coupling in a closed circuit of a negative feedback circuit, the linearity near the folding part of the input, output characteristic may be notably improved.

Incidentally, the resistances R13, R14, R23, shown in FIG. 1 are not particularly essential.

Figure 3:
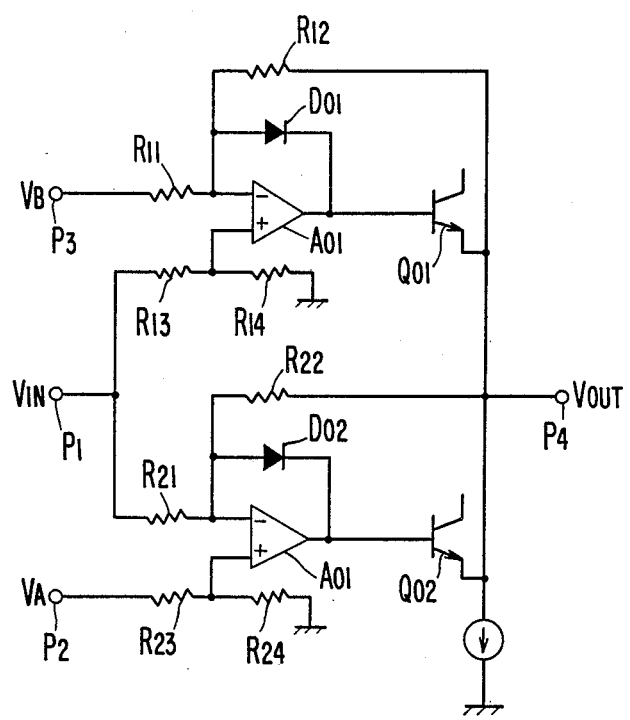
FIG. 3 is a circuit diagram of a folding circuit in a second embodiment of the invention.

FIG. 3 shows a circuit diagram of a folding circuit in a second embodiment of the invention. In this diagram and the anode and cathode of a diode D01 are connected respectively to the noninverting input terminal, output terminal of an operational amplifier A01. The anode and cathode of a diode D02 are similarly connected to the inverting input terminal and output terminal of an operational amplifier A02. The structure is the same as in the first embodiment, except for the diodes D01, D02.

The operation of thus improved folding circuit is similar to that of the first embodiment, except that the diodes D01, D02 prevent the outputs of the operational amplifiers A01, A02 from reaching unnecessarily lower potentials.

Figure 4:
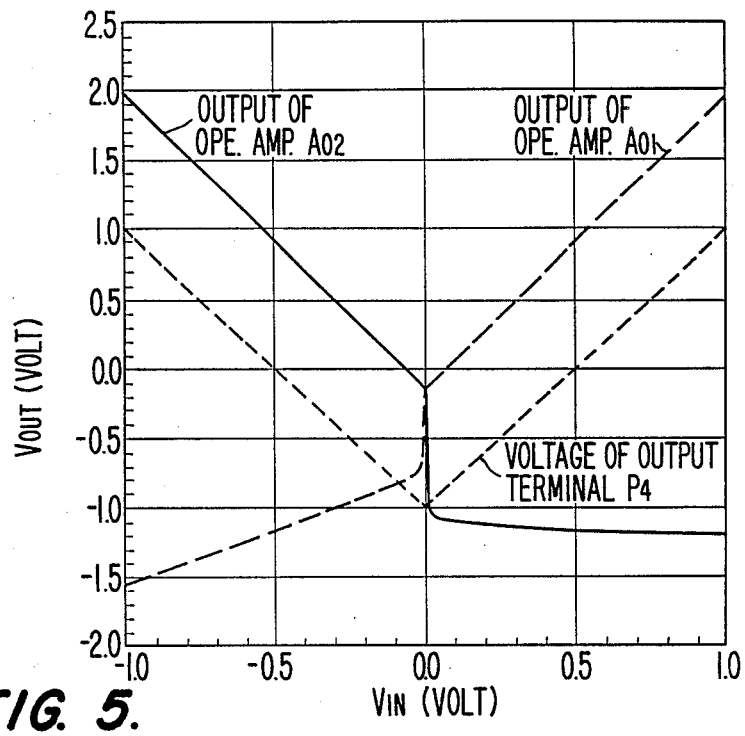
FIG. 4 is an input, output characteristic diagram by simulation of the folding circuit in the first embodiment of the invention.
Figure 5:
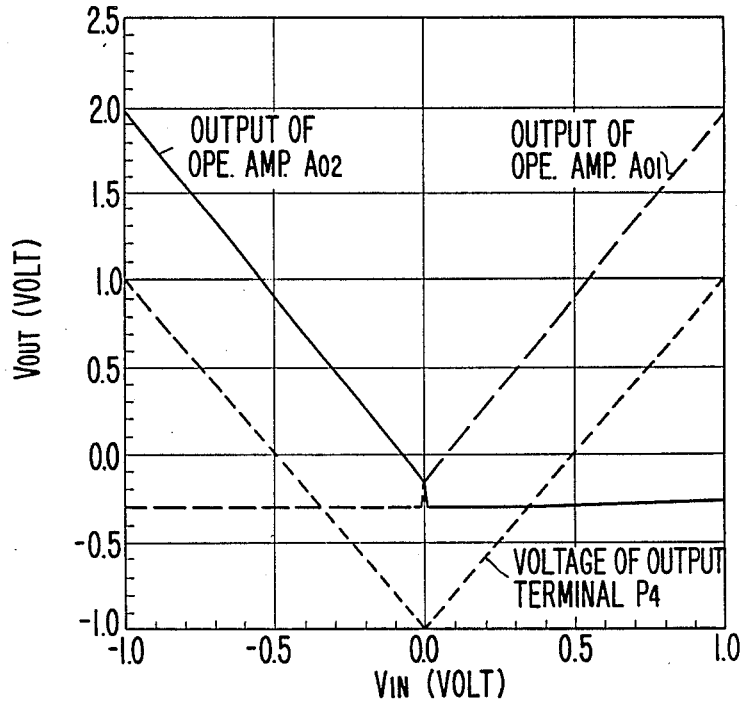
FIG. 5 is an input, output characteristic diagram by simulation when a limiter is added to the same circuit.
Figure 6:
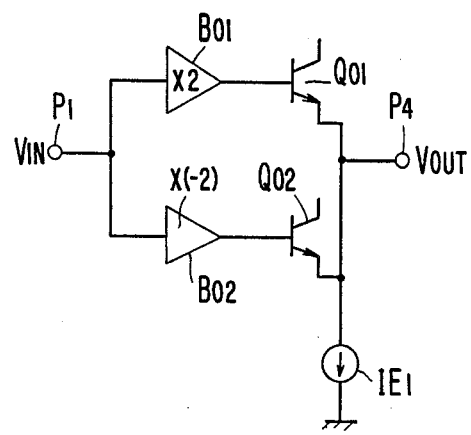
FIG. 6 is a circuit diagram of a conventional folding circuit.
Figure 7:
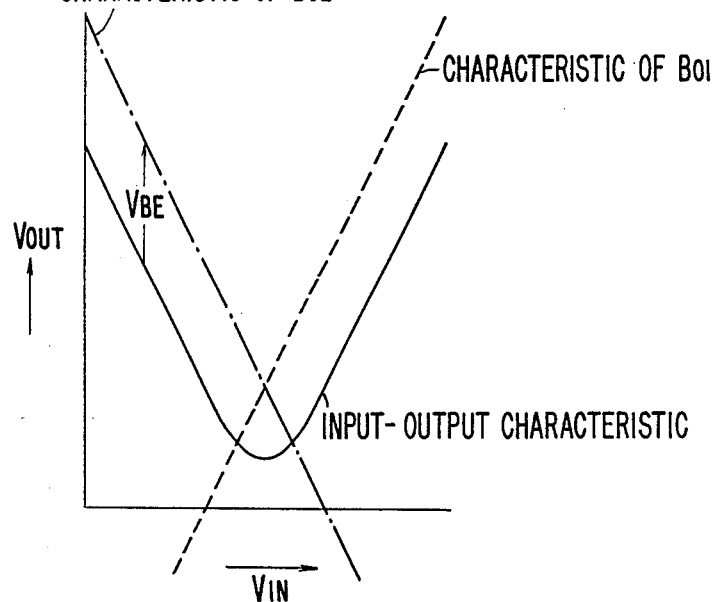
FIG. 7 is an input, output characteristic diagram of the conventional folding circuit.

Simulation results of this embodiment are shown in FIGS. 4 and 5. The solid line refers to the output voltage of the operational amplifier A02, the broken line denotes the output voltage of the operational amplifier A01, and the dotted line represents the voltage of the output terminal P4. When the folding part is magnified, the potential at the folding point is at about 3/(degree of amplification) volts higher, and the error is significantly decreased. Meanwhile, FIG. 5 is the simulation result by installing a limiter inside to prevent the outputs of the operational amplifiers A01, A02 from becoming too low.

Figure 12:
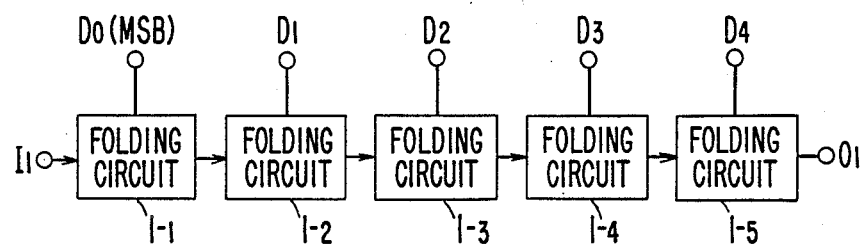
FIG. 12 is a block diagram of a conventional serial-type A/D converter.

The circuit having a comparator incorporated into a folding circuit as shown in FIG. 1 is a unit circuit, and the input of the folding circuit 1-1 is connected to the analog signal input terminal I1 as shown in FIG. 12, and the output of the folding circuit 1-1 is connected serially to the input of the folding circuit 1-2 by the necessary number of bits, so that a serial-type A/D converter may be composed. As the digital outputs, the outputs ranging from the highest bit D0 near the input terminal I1 to lower bits D1, D2, D3, D4 are sequentially obtained.

As explained herein, according to this invention, an accurate folding circuit may be obtained, and it may be applied in a high accuracy serial-type analog-to-digital converter, and its effects of application are significant.

Figure 8:
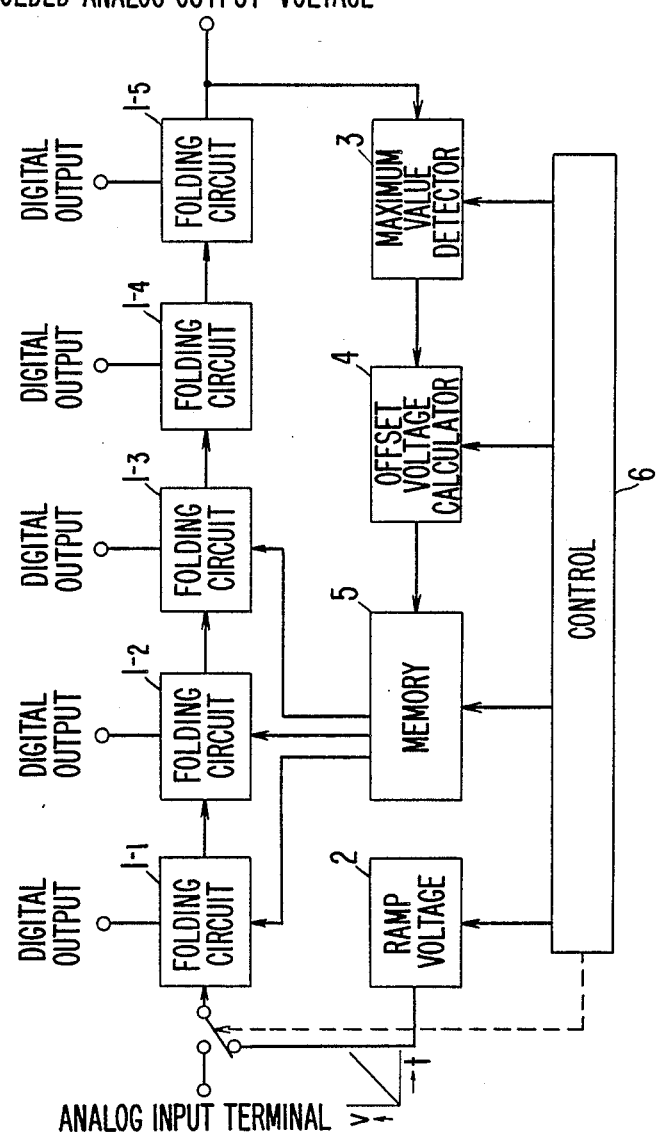
FIG. 8 is a block diagram of a serial-type A/D converter in an embodiment of the invention.

FIG. 8 shows a block diagram of a serial-type A/D converter in a second embodiment of the invention, in which 1-1 to 1-5 denote folding circuits having offset adjusting functions, 2 denotes a ramp voltage generator for scanning the voltage of the analog input terminal, 3 denotes an analog signal maximal value detecting part for picking up the maximal value from the folded analog signal, 4 denotes an operational part for obtaining a correction offset value of each stage from the series of the maximal values of the folding output, 5 denotes a correction offset memory for storing the correction offset values, and 6 denotes a control part for controlling the calibration operation.

The operation of thus composed serial-type A/D converter of this embodiment is explained below.

Figure 13:
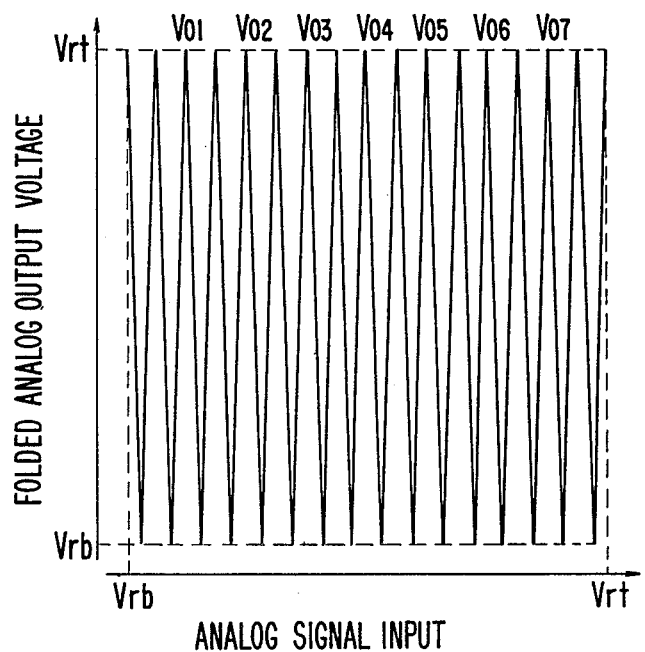
FIG. 13 is an input, a fifth stage output characteristic diagram of analog signal in a serial-type A/D converter.

When calibrating, the output of the ramp voltage generator 2 is applied to the serial-type A/D converter, instead of an analog input signal. This ramp voltage generator 2 generates a voltage for scanning the input dynamic range of the A/D converter. When this ramp voltage passes through the folding circuits 1-1 to 1-5, the analog output of folding circuit 1-5 is folded 31 times as shown in FIG. 13. However, since each one of folding circuits 1-1 to 1-5 contains an individual gain error and offset error, the maximal value and minimal value of the folding output are out of the standard values. Although the minimal value is extremely small in the error because it is only due to the folding circuit 1-5 of the final stage, the error of the maximal value is doubled at every passing through each stage of folding circuit, the error due to the earlier folding circuit is greater.

Figure 10:
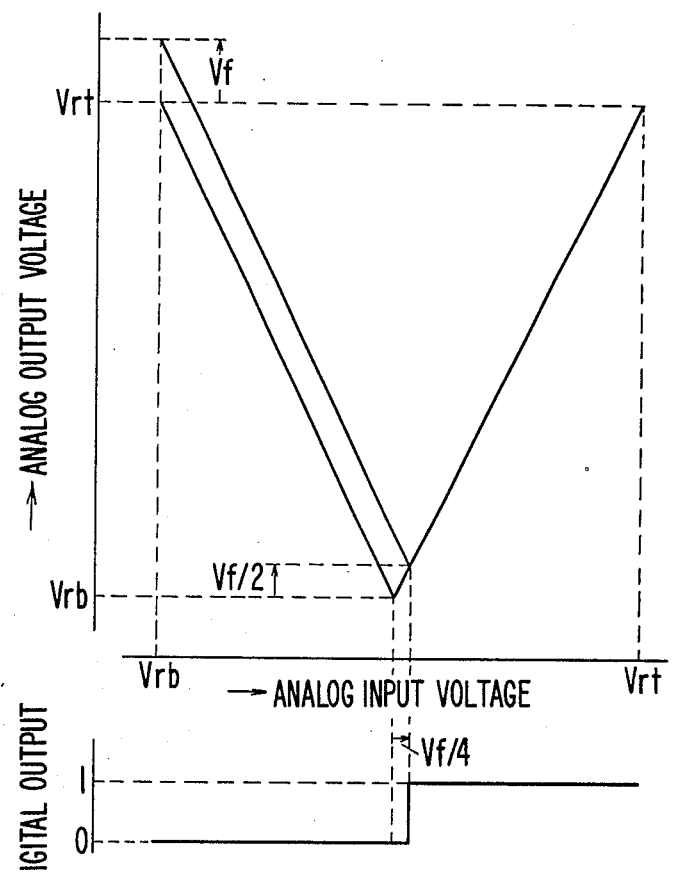
FIG. 10 is an input, output characteristic diagram of a folding circuit having an offset in the inverting system.
Figure 11:
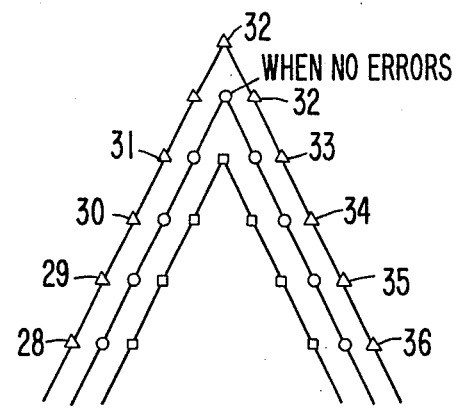
FIG. 11 is a characteristic diagram magnifying the vicinity of the maximal value in the relation between an analog input voltage and an analog output of a certain stage.
Figure 11:
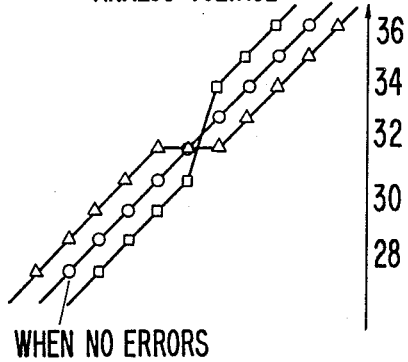

For example, when the first stage folding circuit 1-1 gives an offset error Vf of inverting system as shown in FIG. 10, the minimal value of this stage is shifted to the positive side by Vf/2. The output of the second stage folding circuit corresponding to this point becomes the maximal point, and its maximal value is shifted to the negative side by Vf. Thereafter, the shift of the maximal value is doubled every time.

When the offset of the second stage folding circuit 1-2 is shifted, the maximal values near $\frac{1}{4}$ and $\frac{3}{4}$ of the analog input dynamic range are influenced, and when the offset of the inverting system is adjusted, the maximal value of $\frac{1}{2}$ of the input dynamic range is also influenced.

When the offset of the third stage folding circuit 1-3 is shifted, the maximal values of $\frac{1}{8}$, 2/8, $\frac{3}{8}$, 4/8, $\frac{5}{8}$, 6/8, and $\frac{7}{8}$ of the analog input dynamic range are influenced.

If there are offsets of the noninverting system and inverting system of the folding circuits 1-1 to 1-3, the magnitude of the deviation of the analog output of the folding circuit 1-5 in FIG. 1 to the offset may be summarized as follows.

|  | Position of maximal point | | | | | | |
|---|---|---|---|---|---|---|---|
|  | $\frac{1}{8}$ v01 | 2/8 v02 | $\frac{3}{8}$ v03 | 4/8 v04 | $\frac{5}{8}$ v05 | 6/8 v06 | $\frac{7}{8}$ v07 |
| 1st stage noninverting system | 0 | 0 | 0 | 8 | 0 | 0 | 0 |
| 1st stage inverting system | 0 | 0 | 0 | 8 | 0 | 0 | 0 |
| 2nd stage noninverting system | 0 | 4 | 0 | 0 | 0 | 4 | 0 |
| 2nd stage inverting system | 0 | 4 | 0 | 8 | 0 | 4 | 0 |
| 3rd stage noninverting system | 2 | 0 | 2 | 4 | 2 | 0 | 2 |
| 3rd stage inverting system | 2 | 4 | 2 | 0 | 2 | 4 | 2 |

-continued

| | | Position of maximal point | | | | |
|---|---|---|---|---|---|---|
| ⅛ | 2/8 | ⅜ | 4/8 | ⅝ | 6/8 | ⅞ |
| v01 | v02 | v03 | v04 | v05 | v06 | v07 |

Deviation of maximal value to offset of each stage

According to this table, for example, when the maximal value V03 at the position of ⅜ of the input dynamic range is 20 mV from the standard value, it is known that the maximal value V03 is matched with the standard value when the offset of either the noninverting system or inverting system of the third stage is shifted by −10 mV. At this time, however, since other maximal values are also deviated, due consideration is needed. When correcting each stage, there are many combinations of correction offset values. Supposing the correction offset value of the first stage inverting system to be VA(1), the correction offset value of its noninverting system to be VB(1), the correction offset value of the second stage inverting system to be VA(2), the correction offset value of its noninverting system to be VB(2), the correction offset value of the third stage inverting system to be VA(3), and the correction offset value of its noninverting system to be VB(3), the formulae to obtain the correction offset values may be expressed as follows.

$VA(1) = VA(1) + V04/16 - (V02 + V06)/16 + (V01 + V03 + V05 + V07)/64$
$VA(2) = VA(2) + (V02 + V06)/16$
$VB(3) = VB(3) + (V01 + V03 + V05 + V07)/16$

Figure 14A:
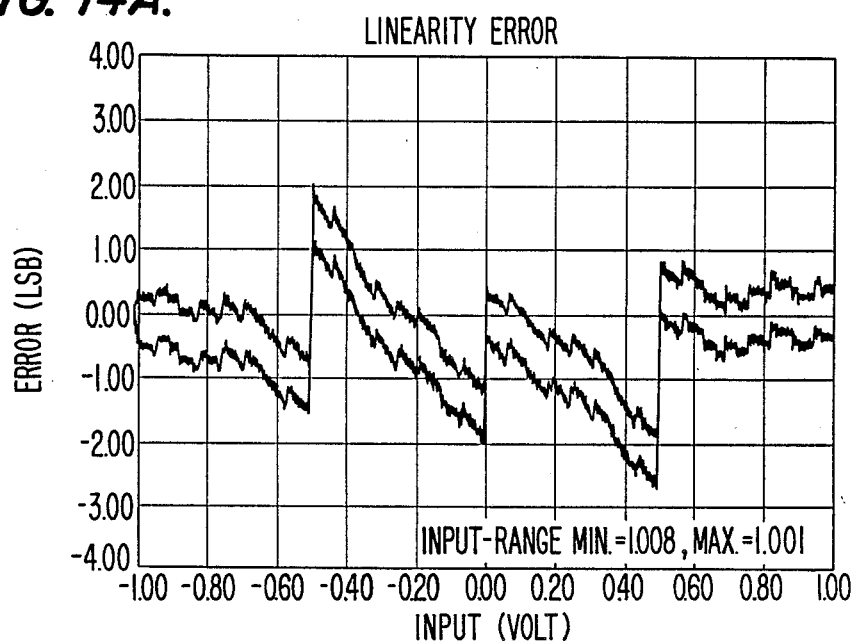
FIGS. 14(a), (b) are simulation characteristic diagrams of an embodiment of the invention.
Figure 14B:
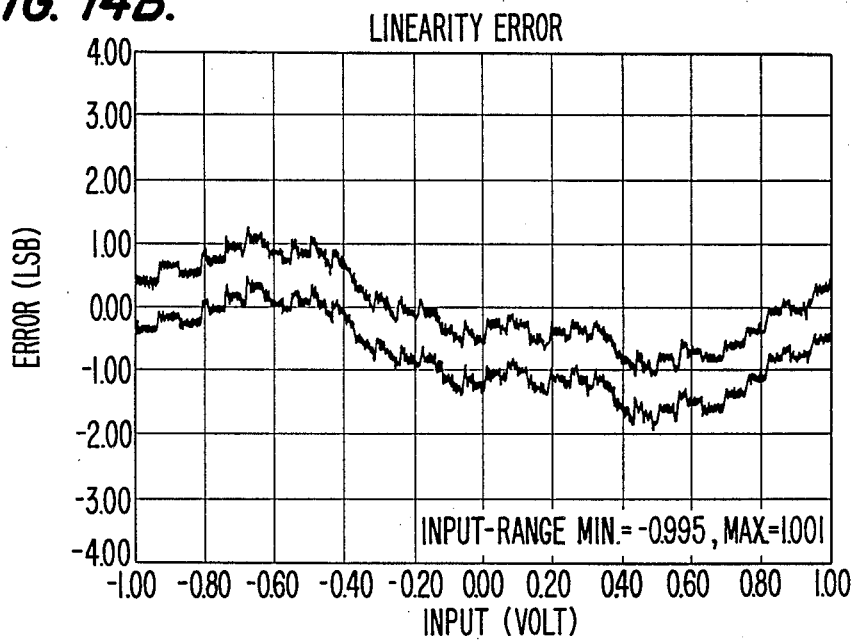

FIGS. 14(a), (b) show the results of simulation of nonlinearity improvement by using the offset values of the results of this calculation. It is known from this diagram that the differential nonlinearity error is improved to about half.

Therefore, after calibrating by storing the offset of each folding circuit obtained in this way into the correction offset memory, when the correction offset is steadily applied in the usual A/D conversion, an A/D conversion without differential nonlinearity error maybe realized.

Thus, according to this embodiment, the differential nonlinearity error may be notably improved by installing the means for determining and applying the correction offset values.

In the second embodiment, the correction offset values are stored, but it is the same in effect when the series of the errors of the maximal points is stored.

As evident from the description herein, this invention can easily fabricate a serial-type A/D converter with a sufficiently small differential nonlinearity error, and its practical effects are tremendous.

What is claimed is:

1. A folding circuit comprising:
   an input terminal;
   an output terminal;
   a first operational amplifier having an inverting input, a noninverting input, and an output, said inverting input of said first operational amplifier coupled to said input terminal;
   a first transistor having a base coupled to said output of said first operational amplifier, and having an emitter coupled to said output terminal;
   a first feedback means for coupling said output terminal to said inverting input of said first operational amplifier;
   a second operational amplifier having an inverting input, a noninverting input, and an output, said noninverting input of said second operational amplifier coupled to said input terminal;
   a second transistor having a base coupled to said output of said second operational amplifier, and having an emitter coupled to said output terminal; and,
   a second feedback means for coupling said output terminal to said inverting input of said second operational amplifier.

2. A serial analog-to-digital converting circuit comprising a plurality of cascade connected folding circuit cells, each of said plurality of cascade connected folding circuit cells including an input terminal and an output terminal, wherein the output terminal of a cascade connected folding circuit cell of a preceding stage is coupled to the input terminal of a cascade connected folding circuit cell of a succeeding stage, each of said cascade connected folding circuit cells further including:
   a first operational amplifier having an inverting input, a noninverting input, and an output, said inverting input of said first operational amplifier coupled to said input terminal;
   a first transistor having a base coupled to said output of said first operational amplifier, and having an emitter coupled to said output terminal;
   a first feedback means for coupling said output terminal to said inverting input of said first operational amplifier;
   a second operational amplifier having an inverting input, a noninverting input, and an output, said noninverting input of said second operational amplifier coupled to said input terminal;
   a second transistor having a base coupled to said output of said second operational amplifier, and having an emitter coupled to said output terminal; and,
   a second feedback means for coupling said output terminal to said inverting input of said second operational amplifier.

3. A serial analog-to-digital converter comprising:
   a plurality of serially connected folding circuits including a first folding circuit, each of said plurality of serially connected folding circuits having an analog input terminal and an analog output terminal, wherein the analog output terminal of a preceding serially connected folding circuit is coupled to the analog input terminal of a succeeding serially connected folding circuit;
   a maximum value detecting means, coupled to the analog output terminal of one of said serially connected folding circuits, for detecting a maximum value of a folded analog signal provided at said analog output terminal of said one of said serially connected folding circuits;
   an offset calculating means, coupled to said maximum value detecting means, for calculating a correction offset value on the basis of a series of maximum values detected by maximum value detecting means, said correction offset value indicative of an estimated offset error;
a correction offset value memory means, coupled to said offset calculating means, for storing said correction offset value calculated by said offset calculating means,
means, coupled to said correction offset value memory means and to at least one of said plurality of folding circuits, for providing said at least one of said plurality of serially connected folding circuits with said correction offset value stored in said offset value memory means;
ramp voltage generating means for generating a ramp voltage signal;

a switching means for connecting said ramp voltage generating means to the analog input terminal of said first folding circuit when said maximum value detecting means is detecting said maximum value; and,
a control means coupled to and for controlling said maximum value detecting means, said offset calculating means, said memory means, and said ramp voltage generating means.

4. A serial analog-to-digital converter as recited in claim 3, wherein an estimated offset error of each serially connected folding circuit is calculated based on a detected maximum value of one of said serially connected folding circuits.

* * * * *